(12) United States Patent
Espersen et al.

(10) Patent No.: US 7,042,723 B2
(45) Date of Patent: May 9, 2006

(54) COOLING ARRANGEMENT FOR AN INTEGRATED CIRCUIT

(75) Inventors: Morten Espersen, Fårup (DK);
Thorben Kristensen, Holstebro (DK)

(73) Assignee: Extreme Cooling Technology ApS, Hobro (DK)

( * ) Notice: Subject to any disclaimer, the term of this patent is extended or adjusted under 35 U.S.C. 154(b) by 0 days.

(21) Appl. No.: 10/467,866

(22) PCT Filed: Feb. 14, 2002

(86) PCT No.: PCT/DK02/00102

§ 371 (c)(1),
(2), (4) Date: Oct. 20, 2003

(87) PCT Pub. No.: WO02/065549

PCT Pub. Date: Aug. 22, 2002

(65) Prior Publication Data

US 2004/0070927 A1    Apr. 15, 2004

(30) Foreign Application Priority Data

Feb. 14, 2001  (DK) ............... 2001 00236
Aug. 25, 2001  (DK) ............... 2001 01265
Nov. 30, 2001  (DK) ............... 2001 01782

(51) Int. Cl.
*H05K 7/20*    (2006.01)

(52) U.S. Cl. .............. 361/699; 361/717; 361/719; 174/15.1; 165/80.4; 257/714

(58) Field of Classification Search ............ 361/689, 361/690, 694–704, 711, 715–719; 257/714–716; 174/15.1, 15.2, 16.1, 16.3; 165/80.4, 104.26, 165/104.33; 62/259.2, 259.4
See application file for complete search history.

(56) References Cited

U.S. PATENT DOCUMENTS 4,341,432 A * 7/1982 Cutchaw ............... 439/485
5,509,468 A * 4/1996 Lopez ................. 165/144
5,574,627 A   11/1996 Porter (Continued)

*Primary Examiner*—Boris Chervinsky
(74) *Attorney, Agent, or Firm*—Dykema Gossett PLLC

(57) ABSTRACT

A cooling arrangement for one or more integrated circuits which are mounted in a socket on a printed circuit board and which each are cooled by a cooling element based on a compressor. The surface of each integrated circuit has arranged thereon a cooling element which is formed by an evaporator in the form of a housing (15) which has a lid with protruding cooling rods. Coolant is supplied to the housing (15) via a supply pipe (22, 23) that ends in an inlet stub (24) in the housing, which is constructed such that the coolant changes its direction, such as 90°, when entering the interior of the housing. The coolant is returned form the housing via an outlet stub (25) which is concentric with the inlet stub (22). The supply pipe has a smaller diameter than the inlet stub (24) and the outlet stub (25), which means that cooling of the coolant and thereby of the cooling rods takes place in the housing, said cooling being transferred to the individual ICs. With a view to avoiding formation of condensate in connection with the cooling process, the housing is fixed against the printed circuit board according to the invention, a sealing material, such as butyl, being arranged between the housing (15) and the printed circuit board (3). For additional sealing, a rear flange may be fixed on the rear side of the printed circuit board in the area where wires are run to the IC, said rear flange being sealed with butyl against the printed circuit board.

10 Claims, 5 Drawing Sheets

U.S. PATENT DOCUMENTS

Figure 1:
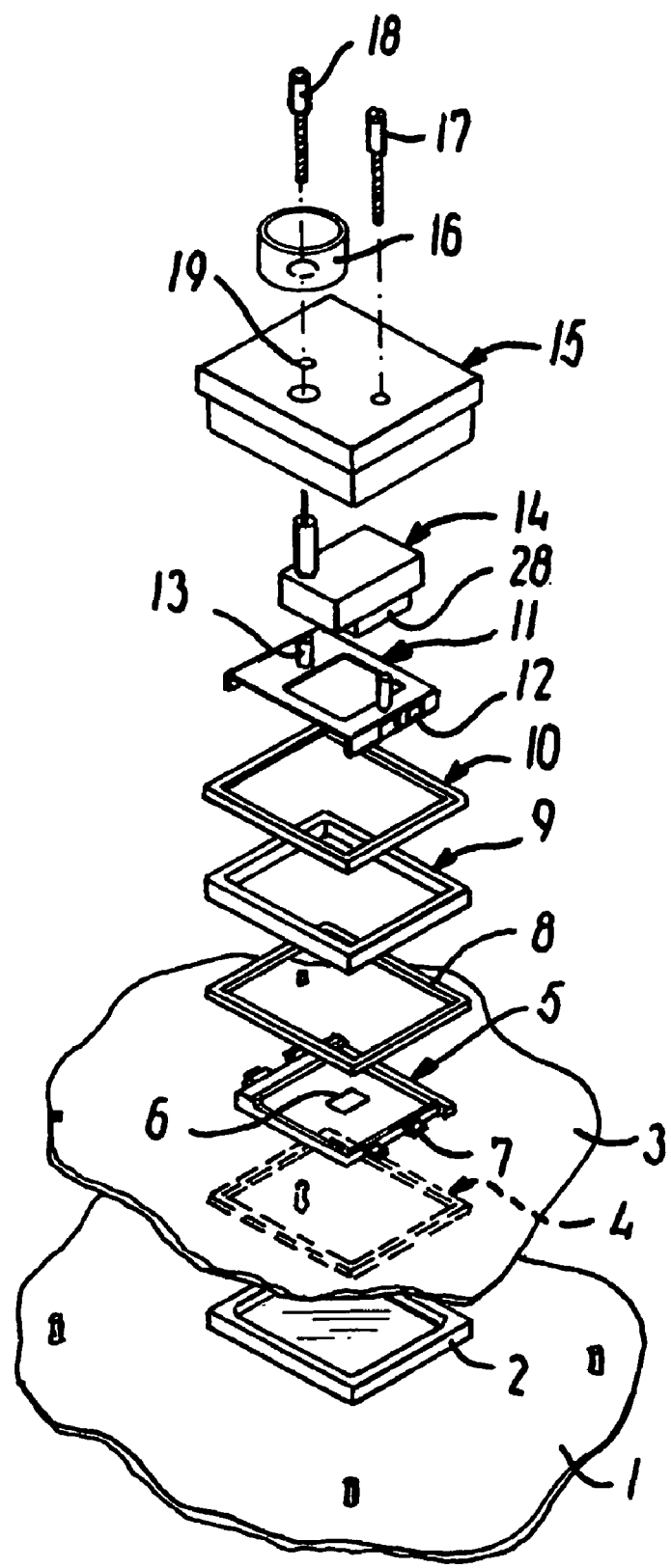

| | | | |
|---|---|---|---|
| 5,881,453 A * | 3/1999 | Avery et al. | 29/834 |
| 5,918,469 A | 7/1999 | Cardella | |
| 5,960,861 A * | 10/1999 | Price et al. | 165/80.3 |
| 6,041,850 A * | 3/2000 | Esser et al. | 165/104.33 |
| 6,054,676 A * | 4/2000 | Wall et al. | 219/209 |
| 6,085,831 A * | 7/2000 | DiGiacomo et al. | 165/104.33 |
| 6,166,907 A * | 12/2000 | Chien | 361/699 |
| 6,243,268 B1 * | 6/2001 | Kang et al. | 361/715 |
| 6,246,581 B1 | 6/2001 | Kang et al. | |
| 6,292,365 B1 * | 9/2001 | Ashiwake et al. | 361/700 |
| 6,323,665 B1 * | 11/2001 | Johnson et al. | 324/760 |
| 6,347,036 B1 * | 2/2002 | Yeager et al. | 361/687 |
| 6,410,982 B1 * | 6/2002 | Brownell et al. | 257/714 |
| 6,523,608 B1 * | 2/2003 | Solbrekken et al. | 165/185 |

* cited by examiner

COOLING ARRANGEMENT FOR AN INTEGRATED CIRCUIT

BACKGROUND OF THE INVENTION

The invention relates to a cooling arrangement for an integrated circuit which is mounted in a socket on a printed circuit board, wherein a cooling element is arranged on the integrated circuit, and wherein the cooling arrangement and the integrated circuit are thermally insulated from the surroundings in a housing whose edge is fixed against the printed circuit board.

THE PRIOR ART

In recent years, cooling of integrated circuits, so-called ICs, has found ever greater use because of the development within the semiconductor technology. An example of this development is the PC systems where the processors, which are the central elements of the computers, constantly enhance their performance. For example, their calculation rates are increased almost month by month.

However, the situation is that the faster the ICs are to operate, the more power must be supplied to them. Conversely, this means that more heat is to be discharged since the performance of the ICs increases at lower temperatures.

The use of the compressor-based IC cooling systems that are known today involves problems of condensate around the IC which is cooled. Typically, it is attempted to remedy this problem by heating the areas which would otherwise be subjected to condensate.

Thus, it is known from U.S. Pat. No. 6,054,676 that the cooling of an integrated circuit, as stated in the patent, has created problems of condensate around the integrated circuit with the consequent risk of short-circuiting of the signal paths that are close to it or the socket in which it is mounted.

To avoid the problems of condensate, a heating element heating the areas around the IC is inserted in an attempt to minimize the problems of condensate.

For several reasons it is inexpedient actively to heat adjacent the area it is attempted to cool. One reason is that in practice the heating element heating the surroundings of the IC will also increase the temperature of the IC, which means in turn that the cooling is not as efficient as it could be if the heating could be omitted.

For the same reasons, a given active cooling of an integrated circuit will thus give a higher performance without local heating than can be achieved if heating is performed in the vicinity of the integrated circuit because of problems of condensate.

Accordingly, an object of the invention is to solve the problem of formation of condensate in the vicinity of an integrated circuit, such as a processor which is cooled e.g. to −40° C. or lower.

The object of the invention is achieved by a cooling arrangement of the type, which is characterized in that a sealing material impermeable to the transport of fluids is arranged between the housing and the printed circuit board.

It is ensured hereby that no ambient air containing water vapour that can condensate because of the lower temperature, can penetrate in the vicinity of the area which is cooled.

Further, it is advantageous if the cooling element is formed by the housing in whose cavity a lid having protruding cooling rods is arranged, said housing with applied lid being formed by an evaporate which has a supply pipe, an inlet stub and an outlet stub for coolant, and that polyethylene foam is introduced in the space between the rods, thereby achieving an extremely effective cooling which minimizes the risk of formation of condensate.

For further prevention of formation of condensate, and with very strong cooling of an integrated circuit or processor, it is an advantage if a bottom flange having a bottom is fixed below the printed circuit board in the area where the wires to the integrated circuit are provided, and that a sealing material is also provided between the bottom flange and the printed circuit.

Hereby, also wires on the printed circuit board where the socket of a processor is arranged, are effectively protected against formation of condensate.

It is noted in this connection that when the sealing material has a glass temperature which is below −50°C., it is ensured that the sealing material remains in a plastic state.

Additionally, when the sealing material is an elastomer, such as ethylene-propylene-diene copolymer, also called butyl rubber, a very effective sealing material is achieved in connection with the sealing of processors which are to be shielded from the ambient air.

To ensure well-defined cooling of an integrated circuit, it is an advantage if the supply pipe for supplying coolant to the inlet stub in the evaporate is constructed such that the coolant changes its direction, e.g., 90°, when entering the inlet stub, and that the diameter of the inlet stub and of the outlet stub is larger than the diameter of the supply pipe.

This results in a "steady" flow and a well-defined mixture of coolant in liquid and vapour form in the evaporator, where the vapours will be above the liquid.

When cooling several integrated circuits from a common compressor-based cooling system, where the same temperature conditions are desired on the integrated circuits irrespective of the amount of energy supplied to them, the temperature conditions may be made uniform if the temperature control of the ICs is performed by adjusting the flow rate and amount of the coolant in the evaporators of the individual IC circuits by generating gas bubbles that decelerate the liquid movement of coolant by local heating of the coolant.

Hereby, the coolant supplied from the common compressor will be distributed between the incorporated evaporators according to how the temperature conditions in ICs are, or rather the difference of the temperatures is.

An alternative way of controlling the temperature condition between several ICs is to provide a setup more particularly by performing the temperature control by adjusting the speed of rotation of cooling blowers which are included in the cooling arrangement and are coupled to their respective condensers.

DETAILED DESCRIPTION OF THE DRAWINGS

Figure 2:
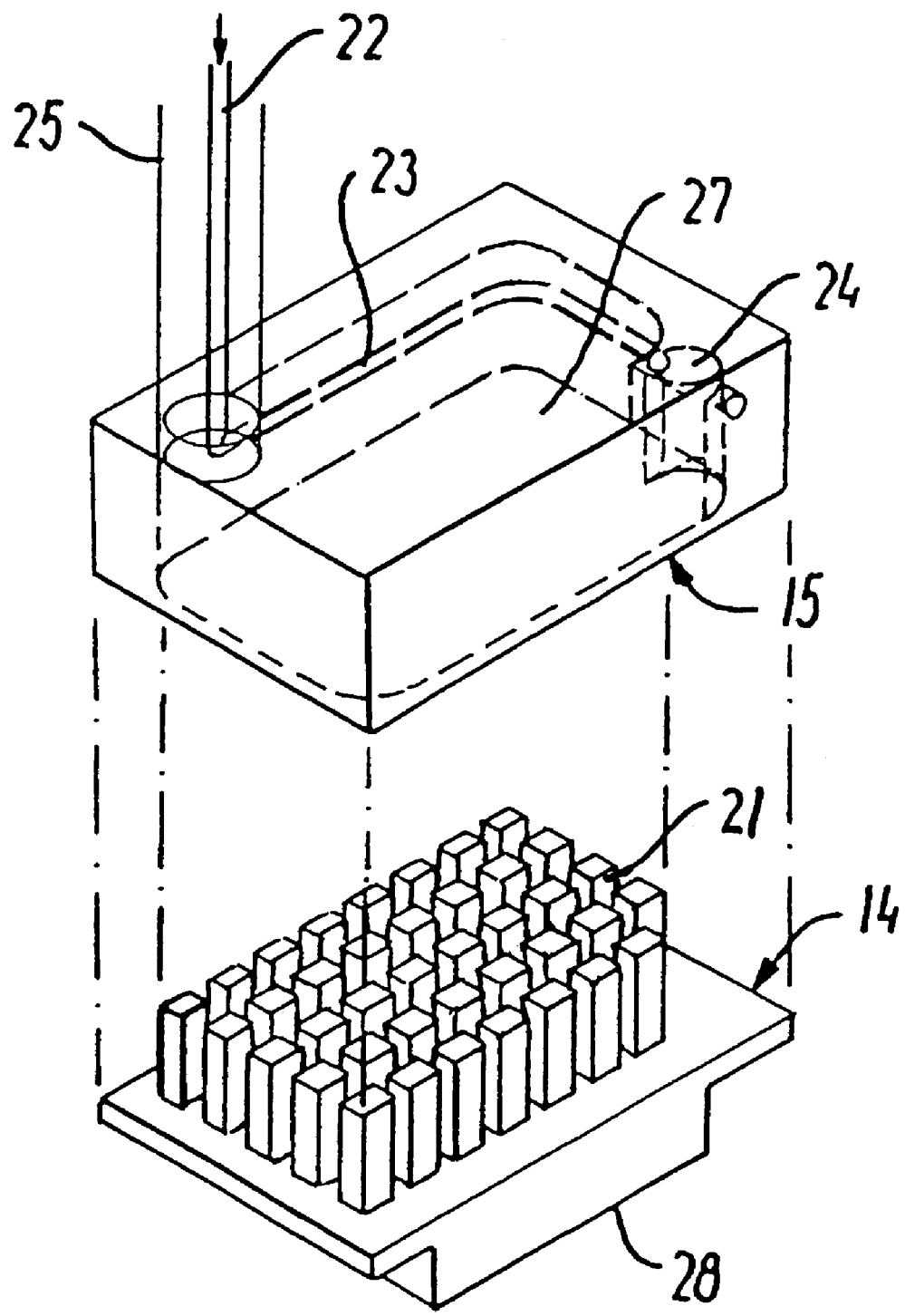
Figure 3:
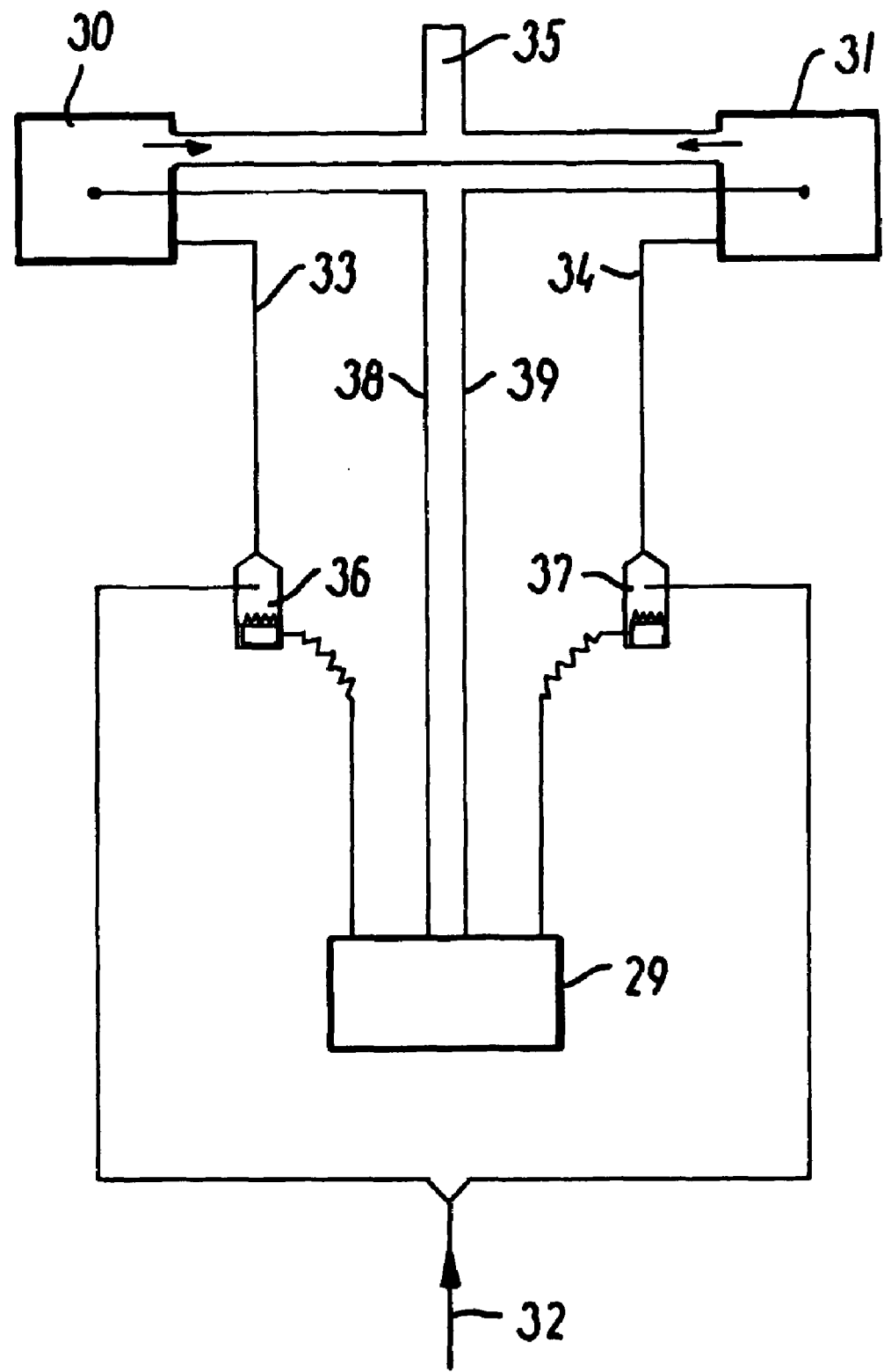
Figure 4:
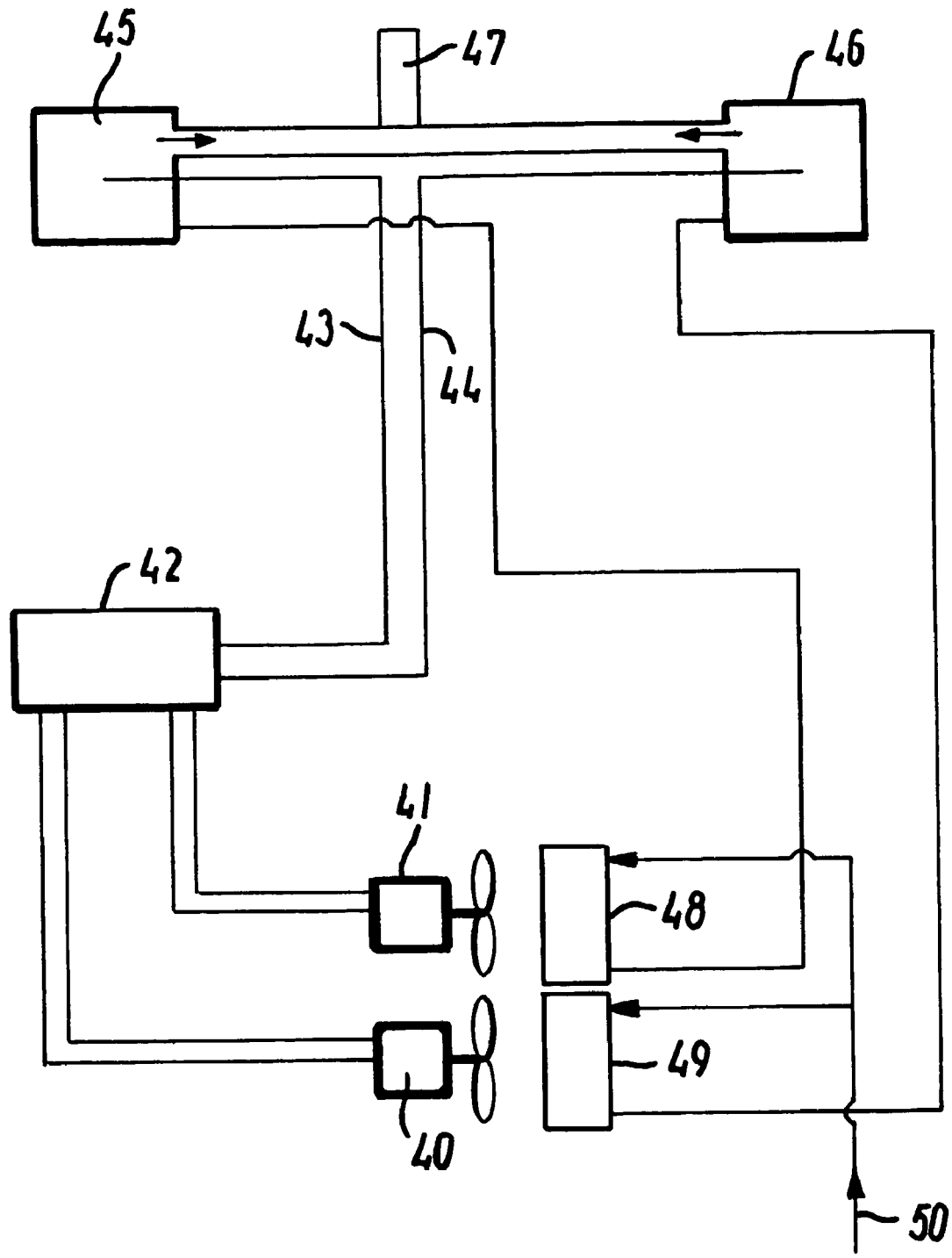
Figure 5:
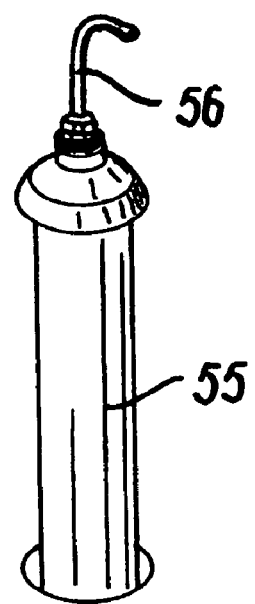
Figure 5:
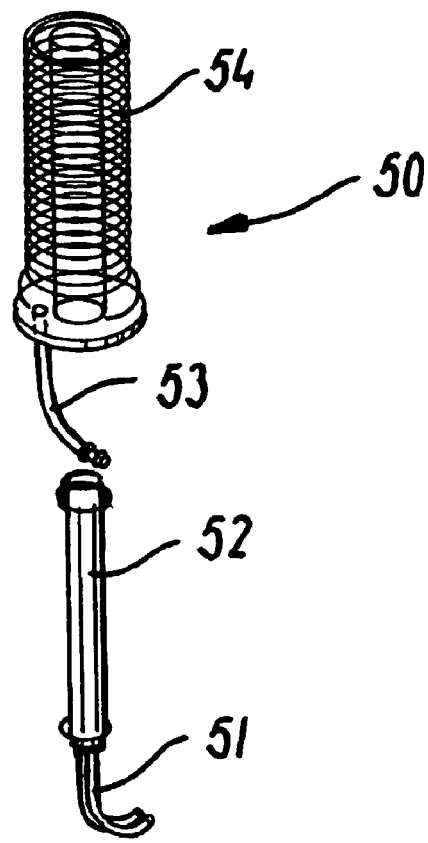

The invention will now be explained more fully with reference to the drawing, in which FIG. 1 shows an embodiment of a structure in a disassembled state of a cooling arrangement for an integrated circuit according to the invention, FIG. 2 shows an evaporator included in the setup of FIG.1 in an enlarged view, FIG. 3 shows a first basic set up of a cooling arrangement in a closed system for the cooling of two integrated circuits according to the invention, FIG. 4 shows a second basic set up of a cooling arrangement in a closed system for the cooling of two integrated circuits according to the invention, while FIG. 5 shows the structure of a heating element for use in the embodiment of FIG. 3.

DETAILED DESCRIPTION OF THE PREFERRED EMBODIMENT

In FIG. 1, the numeral 1 designates a cabinet portion which forms part of a rack or the like.

The cabinet has mounted therein a printed circuit board 3 on which inter alia a socket 5 is mounted, the socket centrally carrying an integrated circuit 6. Locking hooks 7, whose function will be described later, are arranged along two of the edges of the socket 5.

15 designates a housing on which a lid 14 may be applied, which, as will be explained later, constitutes an evaporator in a cooling arrangement according to the invention. As will also be seen, the housing 15 is formed with through holes, one of which is designated 19, through which screws 17, 18 may be received. Finally, a flange 16 is arranged on the upper side of the housing 15, adapted to receive pipes for the supply of coolant, as will be explained in connection with FIG. 2.

These screws 17, 18 may be screwed into holes, one of which is designated 13, in a locking part 11 having recesses 12 along two of its sides, said recesses being capable of engaging the locking hooks 7 on the socket 5.

As will additionally be seen, FIG. 1 shows a sealing material 8 which is adapted to engage the printed circuit board 3 along the periphery of the socket on its one side and to engage the lower edge of the housing 15 on its other side, or, as shown, optionally, but not necessarily to engage one side of a flange 9. In this case, the opposite edge of the flange 9 will adjoin an additional sealing material 10, which in turn adjoins the lower edge of the housing 15.

The parts, which are shown from the printed circuit board 3 and upwards in FIG. 1, are assembled in the following manner:

The locking part 11 with recesses 12 are caused to engage the locking hooks 7 on the socket 5, and then the screws 17, 18 are passed through the holes 19 to the threaded parts 13 on the locking part 11. Hereby, all the parts are clamped together above the printed circuit board 3, and so that the surface of the integrated circuit 6 contacts the lower side of a cooling face 28 on the lid 14 of the housing 15.

Since a sealing material impermeable to fluids, which may be a sealing material of the type butyl, is used between the housing 15 and the printed circuit board 3 in the clamping, it is ensured that no condensate is formed inside the housing 15 when coolant is supplied that may lower the temperature on the surface of the integrated circuit to below −40°C. The reason is that butyl has the property that the ambient air, which contains a good deal of water vapour, cannot pass into the interior housing by passage between the printed circuit board and the housing, since butyl forms a totally tight shield against the surroundings. To additionally ensure that no condensate is formed inside the housing, an additional lid 2 may be arranged on the lower side of the printed circuit board in the area where the electrical connection of the integrated circuit is provided, the additional lid 2 being sealed against the printed circuit board by the provision of a sealing butyl flange 4 between the printed circuit board 3 and the lid 4.

Now, it will be explained more fully in connection with FIG. 2 how the housing 15 with lid 14, which serves as an evaporator in a cooling arrangement according to the invention, is constructed.

As will be seen, the housing 15 has a cavity 27 with an edge into which a supply pipe 22 is inserted, the supply pipe extending along an edge shown at 23 to an inlet stub 24 in the housing which communicates with the cavity 27 of the housing.

In addition, an outlet stub 25, which also communicates with the cavity 27 of the housing, extends concentrically with the supply pipe 22.

The lid 14 of FIG. 1 is shown at the bottom of FIG. 2. This lid has a plurality of cooling rods 21, which have a length that is slightly shorter than the depth of the cavity 27 of the housing 15. The lid is adapted to be positioned in the cavity 27 of the housing 15 without the cooling rods hitting the bottom.

Optionally, polyethylene foam may be introduced into the housing with lid so that all the air is displaced from the cavity 27 of the housing.

As mentioned previously, the bottom of the lid is caused to contact the upper side of the integrated circuit 6 by the clamping of the parts shown in FIG. 1.

The generation of cooling is implemented in the following manner:

Liquid coolant is supplied from a compressor to the supply pipe 22, from which it is conveyed further on in the pipe 23 to the inlet stub 24, where it changes its direction of flow by 90°. As the coolant now enters the cavity 27 of the housing in which there is a lower pressure, the temperature drops noticeably, and a mixture of liquid and vapour is formed in the cavity 27 where the vapour will settle on top of the liquid.

Vapour, perhaps liquid, is returned from the cavity 27 to the compressor and is again fed from the compressor to the supply pipe 22, whereby the cooling process continues in a known manner.

In normal circumstances, condensate would be created in connection with the cooling process, but since the cavity of the housing is cut off from ambient air, and since polyethylene foam is additionally provided in the cavity, no condensate will be formed.

FIG. 3 shows a setup in a closed cooling system in which two IC circuits (not shown) are to be cooled by means of evaporators 30 and 31 which are in contact with IC circuits (not shown). The evaporators are constructed in the same manner as shown in FIGS. 1 and 2. 35 designates an outlet connection to a compressor (not shown). 32 designates a cooling connection from the compressor (not shown), said coolant being supplied via two branches to their respective controllable heating elements 36, 37 (whose structure will be explained in connection with FIG. 5), and further on to supply pipes (not shown) via connections 33, 34 to the evaporators 30, 31.

Temperature signals are passed from the evaporators, or rather the IC circuits (not shown), via conductors 38, 39 to a control unit 29 which emits control signals to the heating elements 36 and 37.

The setup in FIG. 3 operates in the following manner:

If e.g. the evaporator 30 has a lower temperature than the evaporator 31, the temperature difference is recorded by the control unit 29, which sends a signal to the heating element 36 that heats the coolant, thereby generating bubbles in the branch 33 that will brake the flow to the evaporator 30, while the evaporator 31 will have its flow increased, since the total flow to the two evaporators is constant.

FIG. 4 shows a variant of the embodiment of FIG. 3, as two blowers 40, 41 receive control signals from a control unit 42 which are formed on the basis of temperature signals from evaporators 45, 46 connected to their respective IC circuits (not shown). These temperature signals are fed to the control unit via the wires 43, 44, which then adjust the flow to the evaporators 45, 46 by control of the speed of rotation of the shown fans 40, 41. As will additionally be seen, the evaporators communicate with a compressor (not shown) via an outlet stub 47. The difference relative to the setup in FIG. 3 is that each evaporator is connected to its own condenser 48, 49, which is fed from the compressor via the pipe 50. Hereby, it is not necessary to use heating elements for heating the coolant in order to brake its flow. The energy utilization is thereby better than in the embodiment of FIG. 3, but is a little more costly to construct in terms of components.

FIG. 5 shows the structure of a heating element which is included in the setup in FIG. 3, cf. the reference numerals 36 and 37 of this setup.

As will be seen, the heating element consists of a supply pipe 53 for coolant which runs into the space between a vapour dome 55 and a heating surface part 54 inserted into the vapour dome and leaves it in the outlet pipe 56. The heating surface part 54 has centrally inserted therein a heating element 52, which receives energy for heating the coolant via pipes 51 which are positioned between the vapour dome 55 and the heating surface part 54.

The invention claimed is:

1. A cooling arrangement for an integrated circuit which is mounted in a socket on a printed circuit board, comprising,
    an insulating housing positioned around the integrated circuit and defining an edge near the printed circuit board, said insulating housing including an inlet stub for coolant, an outlet stub for coolant, and a supply pipe for supplying coolant to said inlet stub,
    a lid positioned against the insulated housing and on said printed circuit so as to define an evaporation cavity within the housing, said lid including a plurality of cooling rods so that coolant flowing through said evaporator cavity will cool said lid and thus said printed circuit board,
    a sealing material which is impermeable to the transport of fluids circumferentially positioned between the housing and the printed circuit board to prevent air flow therethrough and moisture formation on the printed circuit board, said sealing material being an ethylene-propylene-diene copolymer, and a bottom flange having a bottom fixed below the printed circuit board, and said sealing material is located between the bottom flange and the printed circuit board.

2. A cooling arrangement according to claim 1, wherein the sealing material has a glass temperature which is below $-50°$ C.

3. A cooling arrangement according to claim 1, wherein the sealing material has a good adhesiveness to the housing, and a good adhesiveness to the surface of the mounting plate which is coated with a substance containing a resin.

4. A cooling arrangement according to claim 1, wherein the sealing material has a permeability coefficient to water vapour which is lower than $82.10^{-13}$ at 37.5 degrees Celsius, stated according to the units of the SI system.

5. A cooling arrangement according to claim 1, wherein the supply pipe for supplying coolant to the inlet stub in the evaporator is constructed such that the coolant changes its direction when entering the inlet stub, and the diameter of the inlet stub and of the outlet stub is larger than the diameter of the supply pipe.

6. A cooling arrangement according to claim 3, wherein the housing is made of aluminum.

7. A cooling arrangement according to claim 3, wherein said resin is a epoxy acrylate resin.

8. A cooling arrangement according to claim 1, wherein said evaporation cavity includes polyethylene foam.

9. In a cooling arrangement according to claim 1 for the cooling of two or more ICs using a common, compressor-based cooling arrangement from which coolant is conveyed to all the ICs, and wherein each IC is cooled separately by means of connected evaporators, a method wherein the temperature control of the ICs is performed by adjusting the flow rate and amount of the coolant in the evaporators of the individual IC circuits by generating gas bubbles that decelerate the liquid movement of coolant by local heating of the coolant.

10. A method according to claim 9, wherein the temperature control is performed by adjusting the speed of rotation of cooling blowers which are included in the coolant arrangement and are coupled to their respective condensers.

* * * * *